US006806193B2

(12) United States Patent
Korthuis et al.

(10) Patent No.: US 6,806,193 B2
(45) Date of Patent: Oct. 19, 2004

(54) CMP IN-SITU CONDITIONING WITH PAD AND RETAINING RING CLEAN

(75) Inventors: Vincent C. Korthuis, Corvallis, OR (US); Mona Eissa, Plano, TX (US); Yaojian Leng, Plano, TX (US); Syed Hamid, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/342,547

(22) Filed: Jan. 15, 2003

(65) Prior Publication Data

US 2004/0137739 A1 Jul. 15, 2004

(51) Int. Cl.[7] .......................... H01L 21/304; B24B 1/00

(52) U.S. Cl. .......................... 438/692; 438/693; 451/41; 451/56; 216/88; 216/89

(58) Field of Search ..................... 456/41, 56; 438/692, 438/693; 216/88, 89

(56) References Cited

U.S. PATENT DOCUMENTS 6,004,193 A * 12/1999 Nagahara et al. ........... 451/285
6,443,814 B1 * 9/2002 Miller et al. .................. 451/41
6,464,568 B2 * 10/2002 Miller et al. .................. 451/41
6,595,831 B1 * 7/2003 Hirokawa et al. ............ 451/36
6,602,436 B2 * 8/2003 Mandigo et al. .............. 216/88
6,645,052 B2 * 11/2003 Jensen et al. ................. 451/41
2002/0016136 A1 * 2/2002 Birang et al. .................. 451/41
2002/0182994 A1 * 12/2002 Cooper et al. .............. 451/397
2003/0153250 A1 * 8/2003 Boyd et al. ................... 451/41

OTHER PUBLICATIONS

T. Cacouris, *Preventing Cross–Contamination Caused By Copper Diffusion*, Yield Management Solutions, Autumn 1999, pp. C–13–C17.

K. Devriendt et al., *CMP Defect Detection and Process Control using the Surfscan SP1*[TB], *Yield Solutions, Summer 2000*, pp. 72–73.

J. T. Pan et al., *Copper CMP and Process Control*, Tony Pan, Jan. 1, 1999, pp. 1–7.

C. C. Garretson et al., *New Pad Conditioning Disk Design Delivers Excellent Process Performance White Increasing CMP Productivity*, CMP Technology for ULSI Interconnection, SEMICON West 2000, © SEMI 2000, 9 pp.

* cited by examiner

*Primary Examiner*—M. Wilczewski
(74) *Attorney, Agent, or Firm*—Yingsheng Tung; Wade James Brady, III; Frederick J. Telecky, Jr.

(57) ABSTRACT

A method for preconditioning a CMP polishing pad and retaining ring prior to semiconductor wafer polishing. In the method of the present invention, the retaining ring is lowered to contact the rotating polishing pad, and a cleaning chemistry of ammonium citrate is applied to the pad. In an alternative embodiment, the cleaning chemistry comprises an aqueous solution of ammonium citrate, and a surfactant and/or copper inhibitor. After a sustained preconditioning period in which the retaining ring and polishing pad are polished, the pad is rinsed, lowering particulate buildup on the pad between wafer polishing steps, and bringing defect levels into an equilibrium state prior to each wafer polishing step.

31 Claims, 2 Drawing Sheets

CM P IN-SITU CONDITIONING WITH PAD AND RETAINING RING CLEAN

CROSS-REFERENCE TO RELATED APPLICATIONS

Not applicable.

STATEMENT REGARDING FEDERALLY SPONSORED RESEARCH OR DEVELOPMENT

Not applicable.

TECHNICAL FIELD OF THE INVENTION

The present invention relates generally to a method for reducing particulate defects on the surface of semiconductor wafers during the fabrication process. In particular, the invention relates to a method for reducing particle defects introduced during the chemical mechanical polishing or planarization (CMP) operation in the wafer fabrication process. More specifically, the invention relates to a method for preconditioning the CMP polishing pad and retaining ring with a cleaning chemistry for the purposes of particle and defect reduction.

BACKGROUND OF THE INVENTION

Modern-day semiconductor devices, commonly called microchips or integrated circuits, are fabricated in "cleanroom" environments using a multi-step process that constructs numerous integrated circuits in the form of chips, or "die," on disc-shaped wafers. Due to the miniscule scale of circuitry on each integrated circuit, it is critical to the fabrication process that the wafers remain as clean and particle-free as possible, as even tiny particles may lead to defects that render a device inoperable, consequently lowering yield and associated profits. Critical to improving yield is raising the number of good die per wafer. To accomplish this, the semiconductor industry is moving in the direction of larger-diameter wafers and smaller die, so that more integrated circuits can be "squeezed" onto a single wafer. Also, more effective and efficient methods are sought for reducing particulate contamination of the wafers during the fabrication process.

Since the late 1950s, integrated circuit technology has evolved rapidly and has revolutionized virtually every industry and capacity in which integrated circuits are used. Today's integrated circuits frequently employ hundreds of thousands or even millions of transistors and highly complex, multi-layered designs. The proliferation of electronics in general, and integrated circuits in particular, has resulted in large part from the ability to increase circuit functionality while simultaneously reducing device cost and size. An important catalyst for these improvements has been advances in semiconductor processing technologies, the various techniques used to construct circuit elements—e.g., transistors, resistors and capacitors—on the semiconductor substrate, as well as the necessary conducting interconnects between individual circuit elements. Improved materials, equipment and processes have allowed increasingly complex circuits with improved speed, reduced power requirements and smaller footprints.

Integrated circuits are typically constructed at the surface of a silicon wafer sliced from a single-crystal ingot, although other semiconductors such as gallium arsenide and germanium are also used. Individual circuit elements are fabricated on the wafer surface. The electrical conduction between appropriate circuit elements, and electrical isolation between other circuit elements, is then established using alternating layers of appropriately patterned conductors and insulators. The circuit elements and their interconnections are formed using a series of processing steps including ion implantation, thin film deposition, photolithography, selective etching, as well as various cleaning processes.

As die sizes shrink with newer technology, the functionality of integrated circuits is increasing, as are the number of active metal layers on each die. Integrated circuits are fabricated in layers using several complex operations, with many processes repeated as each layer is created. An inlaid or damascene interconnect scheme is typically used for forming copper metallization, wherein an insulating dielectric layer is deposited, followed by the formation of trenches and vias through patterning and etching processes. A diffusion barrier and copper seed layer are then deposited, followed by electrochemical plating of the copper to fill the trenches and vias. A chemical mechanical planarization (CMP) process is then used to remove the excessive portion of the copper and to planarize the surface of the wafer.

The slurries used in CMP are best classified by the types of layers, or films, they are intended to planarize. In semiconductor manufacturing, CMP processes are most commonly used for films comprised of silicon oxide, tungsten, copper, tantalum and titanium. CMP of copper films, for example, often employs slurries based on ammonia, which offers high copper ion solubility through ion complexation.

In addition to polishing of metallization layers, CMP processing generally also involves barrier layer and dielectric layer polishing. A barrier layer is a layer disposed between two layers that prevent one layer from contaminating the other layer and vice versa. Copper metallization schemes often employ barrier metals such as tantalum or tantalum-rich alloys between the copper and dielectric layers to minimize cross-contamination between those layers. Dielectric layers provide electrical isolation between conducting layers, and are frequently comprised of an oxide material such as silica. An integrated CMP processing technique should allow the polishing and planarization of alternating layers such as those described—e.g., a layer comprising copper on a layer comprising tantalum on a layer comprising oxide.

Photolithography involves spinning a light-sensitive photoresist material onto the wafer surface. Next, using precise optical processes, individual integrated circuits are formed by repetitively exposing a pattern on a glass mask, or reticle, in a grid-like fashion onto the photoresist material. The exposed photoresist material is typically cured and developed, then dissolved areas of the photoresist are rinsed away, leaving the wafer ready for etching or implant doping. The aforementioned processes are generally repeated as each metal layer is fabricated, with some advanced microprocessors requiring seven or more metal layers.

As the number of layers fabricated on a wafer increase, planarity and cleanliness of the wafer surface become paramount, as minute features created on the wafer surface must line up with corresponding features on the layer below. Such features are often only a fraction of a micron wide (where a micron is one millionth of a meter) so it is critical that the wafer surface be substantially free of topological defects, as with every subsequent layer, any topological defect becomes magnified. Surface non-planarity or particulate matter on the wafer surface can lead to feature registration issues, when the components on adjacent layers do not "line up" properly, potentially leading to nonfunctional or faulty integrated circuits.

A primary challenge in wafer fabrication is the continuing reduction of defect levels. Defects potentially present on wafer surfaces include CMP slurry residue, oxides, organic contaminants, mobile ions and metallic impurities. Generally, a "killer defect" (particle) can be as small as half the size of the device linewidth. For instance, a device using 0.18-micron (μm) linewidth geometry will require that the wafer be substantially free of particles as small as 0.09 μm, and at 0.13 μm geometry, particles as small as 0.065 μm. Due to their smaller size, it is physically more difficult to remove smaller particles than larger particles, so it is beneficial to prevent deposition of particles onto the wafers as much as possible.

Increasingly complex integrated circuits utilize an increasing number of circuit elements, which in turn requires both more electrical conduction paths between circuit elements and a greater number of conductor-insulator layers to achieve these paths. This has proved problematic for several reasons. First, longer interconnect paths means increasing resistance and capacitance, which not only decreases circuit speed by increasing RC-delay times but also increases resistive power loss. Second, an increasing number of layers makes successive layer-to-layer alignment, or registration, more difficult. Layers that lack global and local planarity further compound the registration problem. Historically, the techniques available to improve layer planarity in the semiconductor industry have been quite limited.

Until recently, aluminum was the interconnect conductor of choice in integrated circuit fabrication. Techniques for depositing thin aluminum films are well established and, because aluminum trichloride is somewhat volatile, aluminum can be etched effectively in chlorine plasmas to form patterned aluminum films following appropriate photolithography steps. At the same time, aluminum interconnects have several undesirable properties. First, aluminum is not an exceptionally good conductor; its resistivity is considerably higher than some other metals. Second, aluminum is particularly susceptible to electromigration, the physical movement of a conductor due to electron flow. Electromigration at grain boundaries results in conductor discontinuities and reduced circuit reliability.

The semiconductor industry is transitioning from aluminum to copper as the electrical conductor of choice for establishing interconnections between circuit elements. Copper has a significantly higher conductivity than aluminum and is inherently more resistant to electromigration. Although these properties of copper have been known for a long time, the absence of acceptable methods for selectively etching or otherwise removing copper have limited its use. Unlike aluminum, copper is not amenable to plasma etch. Thus, a key limitation in moving to copper metallization is the ability to etch or otherwise remove copper at the wafer surface. Improved CMP technologies are facilitating the shift to copper metallization, as CMP not only provides a method for copper removal and for forming patterned copper films, but also addresses the increased need for local and global planarity in complex integrated circuit architectures.

Today, CMP is an essential step in the manufacture of almost every modern integrated circuit. According to the 1997 National Technology Roadmap for Semiconductors, the typical logic device in 2004 will include seven innerlayer dielectric (ILD) CMP steps, seven metal CMP steps and one shallow trench isolation (STI) CMP step. Put simply, CMP is quickly becoming a central aspect of semiconductor processing in the formation of integrated circuits.

The CMP operation generally serves to remove excess coating material, reduce wafer topographical imperfections, and improve the depth of focus for photolithography processes through better planarity. The CMP process involves the controlled removal of material on the wafer surface through the combined chemical and mechanical action on the semiconductor wafer of a slurry of abrasive particles and a polishing pad. During the CMP operation, sub-micron-size particles from the associated polishing slurry are used to remove non-planar topographical features and extra coating on the wafer surface. After the CMP operation, these ultra-small slurry particles, typically silica ($SiO_2$) or alumina ($Al_2O_3$), and particles from the polishing pad and polished wafer may remain on the wafer surface and can be problematic.

Following the CMP process, wafers are typically subjected to a post-CMP cleaning process to remove particulate and molecular contaminants before continuing the construction of the integrated circuit. For wafers processed in batches, rather than individually, storage techniques are used following the CMP process and prior to the post-CMP cleaning process. Storing the wafers frequently consists of placing them in a cassette filled with an appropriate liquid such as water.

For a variety of reasons, currently available CMP techniques are less than optimal. First, the CMP process involves the use of small, abrasive particles that can prove difficult to remove from the wafer surface. Although the slurry particles serve a valuable role during CMP, they constitute particulate defects following the CMP process. Consequently, techniques for improving the removal efficiency of slurry particles are desirable. In addition, molecular contaminants can be introduced during the CMP process that are not always effectively removed during post-CMP cleaning.

For batch-processed wafers, the wafer storage process can introduce additional problems. It has been noted that wafers removed from storage solutions can evidence streaking wherein contaminants appear preconcentrated in certain areas on the wafer surface. Furthermore, exposed copper surfaces are susceptible to corrosion, resulting in undesirable etching during the post-CMP storage and cleaning processes as well as potential electrical failure.

Defect levels on semiconductor wafers are closely monitored after several operations in the wafer fabrication process. One effective and quick way of measuring defect levels is to subject a wafer to a surface scanning process, which detects surface irregularities and particulate contamination with beams of laser light. As the CMP process is now widely used to provide global planarity of layers during wafer fabrication, successful yield management of CMP requires detection of critical defects such as non-uniform film thickness or process variations within a wafer lot. CMP defects can generally be separated into two categories: residual slurry particles or other foreign material on the wafer surface, and scratches, grooves or pits in the wafer surface itself. Both defect types are known to have a negative impact on device yield.

As is it often difficult to remove minute particles from the surfaces of wafers, new methods for reducing particulate contamination and buildup are always sought. Not only can particles cause killer defects by their very presence, they may also contribute to wafer surface damage, such as the aforementioned scratches, during subsequent post-CMP cleaning operations. Wafer surface damage can exacerbate particle removal difficulties, as particulate matter may become entrapped in grooved or scratched wafer surfaces. The shortcomings of the conventional CMP method become apparent during post-CMP defect detection, as defect levels are generally higher than desired. Consequently, it is desired to reduce defect levels on the polishing pad and head before polishing a wafer. It is further desired to develop a CMP method that reduces the possibility for particulate build-up between wafer polishing operations.

BRIEF SUMMARY OF THE PREFERRED EMBODIMENTS

The preferred embodiments of the present invention include improved methods and compositions for chemical mechanical polishing (CMP) of a semiconductor wafer. The present invention teaches a CMP process further including the preconditioning steps of applying a cleaning chemistry to a polishing pad, contacting the polishing pad with a retaining ring, polishing the retaining ring and polishing pad with the cleaning chemistry, and removing the cleaning chemistry from the polishing pad. In a preferred embodiment, the cleaning chemistry comprises an aqueous solution between about 5 percent by weight and about 40 percent by weight of ammonium citrate, and preferably about 25 percent by weight of ammonium citrate. In an alternative embodiment, ascorbic acid, citric acid or other citric-based solutions having a relatively low pH may be used. Alternatively, cleaning chemistries with relatively high pH values, such as tetramethylammonium hydroxide (TMAH) or potassium hydroxide (KOH), may be most effective at removing other types of slurries.

NOTATION AND NOMENCLATURE

Certain terms are used throughout the following description and claims to refer to particular system components. As one skilled in the art will appreciate, semiconductor companies may refer to processes, components, and subcomponents by different names. This document does not intend to distinguish between components that differ in name but not function. In the following discussion and in the claims, the terms “including” and “comprising” are used in an open-ended fashion, and thus should be interpreted to mean “including, but not limited to . . . . ”

The term “semiconductor device” refers generically to an integrated circuit, which includes internal electrical circuit elements and is fabricated upon a semiconductor substrate. A semiconductor device may be integral to a wafer, singulated from a wafer, or packaged for use on a circuit board. The term “integrated circuit” refers to a semiconductor device. The term “circuit element” refers to the individual electrical components comprising an integrated circuit, including transistors, resistors and capacitors. The term “die” refers generically to one or more integrated circuits, in various stages of completion, whether integral to a wafer or singulated from the wafer. The term “wafer” refers to a generally round, single-crystal semiconductor substrate upon which integrated circuits are fabricated in the form of die.

To the extent that any term is not specially defined in this specification, the intent is that the term is to be given its plain and ordinary meaning.

BRIEF DESCRIPTION OF THE DRAWINGS

For a more detailed description of the preferred embodiment of the present invention, reference will now be made to the accompanying drawings, wherein.

DETAILED DESCRIPTION OF PREFERRED EMBODIMENTS

The preferred embodiments of the present invention entail integrating a polishing pad and retaining ring preconditioning step with a conventional chemical mechanical planarization (CMP) process to reduce particulate defect levels on the polishing head of a CMP apparatus. It will be understood that, while the present invention refers to a “preconditioning” step, when a sequence of wafers are polished, the preconditioning step of the present invention may be perceived as following, instead of preceding, a wafer polish. As a sequence of wafers generally undergo the CMP process, applying the preconditioning method of the preferred embodiments after polishing a wafer can likewise be viewed as occurring before to polishing the next wafer in process. The term “preconditioning” is used to differentiate the CMP apparatus cleaning in accordance with the preferred embodiments from conventional pad “conditioning” carried out by a conditioning disk, typically in the absence of any cleaning chemistry, also to be discussed herein.

It is especially important to maintain low defect levels and achieve high die yields when semiconductor wafers are fabricated for a qualification process, a period of extensive testing to demonstrate the functionality of integrated circuits under various conditions. It is also crucial to maintain low defect levels for production wafers, which generally consist of qualified products that are shipped to customers. Variations from an expected range of defects are generally referred to as “excursions.” Yield-limiting defect excursions may be related to a fabrication process or operation that is not achieving optimal results, a dirty process tool, or an ineffective cleaning operation.

Figure 1:
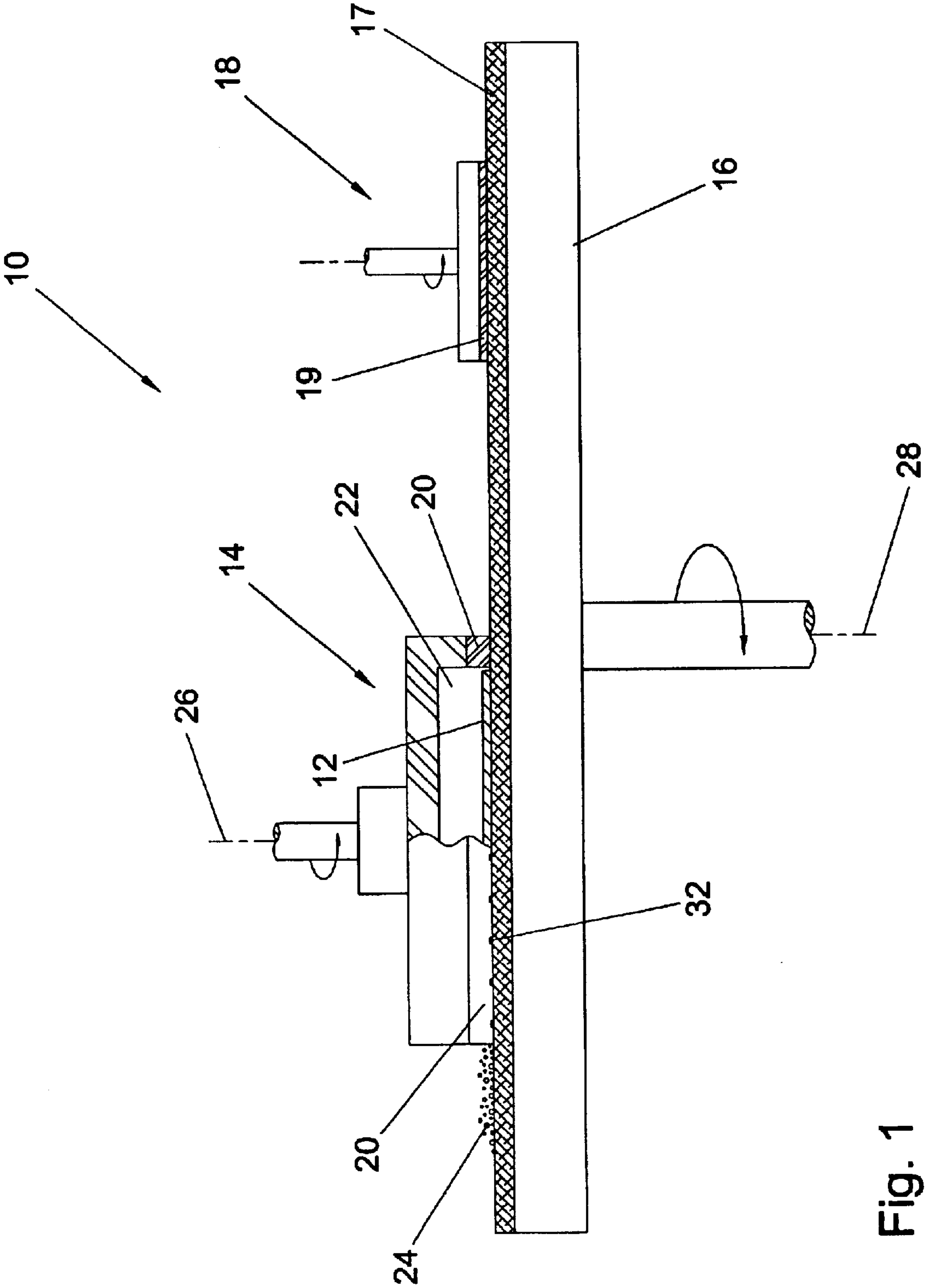
FIG. 1 is a sectional view of a conventional CMP apparatus during a wafer polishing operation.

FIG. 1 shows a side view of a conventional simplified CMP apparatus 10 for polishing semiconductor wafer 12. CMP apparatus 10 comprises a wafer carrier (polishing head) 14, platen 16 supporting polishing pad 17, and pad conditioner 18 including conditioning disk 19. Polishing head 14 includes an annular retaining ring 20, a pocket 22 for housing the wafer 12, and a plurality of variable-pressure chambers (not shown) for exerting either suction or pressure onto the backside a wafer, as well as other internal components.

Conditioning disk 19 is typically a substantially circular pad having an abrasive surface that contacts and moves over wafer polishing pad 17 in a predetermined pattern during wafer polishing. Pad conditioning is required to obtain and maintain and acceptable oxide removal rate and stable CMP process performance. Pad conditioning helps to maintain optimal surface roughness and porosity of polishing pad 17, ensuring proper transport of slurry 24 to the surface of wafer 12 as well as the removal of CMP residue, but generally does not provide desired particle reduction levels. CMP apparatus 10 generally includes a controller (not shown) that allows a variable down force to be applied to polishing head 14, allows polishing head 14 and platen 16 to be rotated at variable and independent rates, and allows slurry 24 and/or other materials to be applied to polishing pad 17.

During operation, a pre-selected down force is preferably applied to polishing head 14 to achieve a desired polish pressure. Also during operation, polishing head 14 is preferably rotated about spindle axis 26 at a desired rate while platen 16 is preferably rotated around platen axis 28 at an independent desired rate. Preferably, abrasive slurry 24 having a pH between about 3 and about 11 and comprised of slurry particles having an average diameter of between about 20 and about 200 nanometers (nm) is present during polishing. More preferably, the slurry particles are comprised of silica ($SiO_2$) or alumina ($Al_2O_3$), depending on the surface to be polished. The combined action of the downforce of polishing head 14, the respective rotations of polishing head 14 and platen 16, and the chemical and mechanical effects of abrasive slurry 24 combine to polish the surface of wafer 12 to a desired planarity and thickness.

In more detail, in a typical CMP process, wafer 12 is held inside pocket 22 with upward suction applied to its back surface so as to keep the wafer raised above the lower face of retaining ring 20. A spindle motor (not shown) then begins rotating head 14 around spindle axis 26. Meanwhile, polishing head 14 is lowered, retaining ring 20 is pressed onto pad 17, and retaining ring 20 is polished by pad 17, with wafer 12 recessed just long enough for polishing head 14 to reach polishing speed. When polishing head 14 reaches wafer polishing speed, typically about three seconds later, wafer 12 is lowered facedown inside pocket 22 to contact the surface of polishing pad 17, so that the wafer is substantially flush with and constrained outwardly by retaining ring 20. Retaining ring 20 and wafer 12 continue to spin relative to pad 17, which is rotating along with platen 16.

Figure 2:
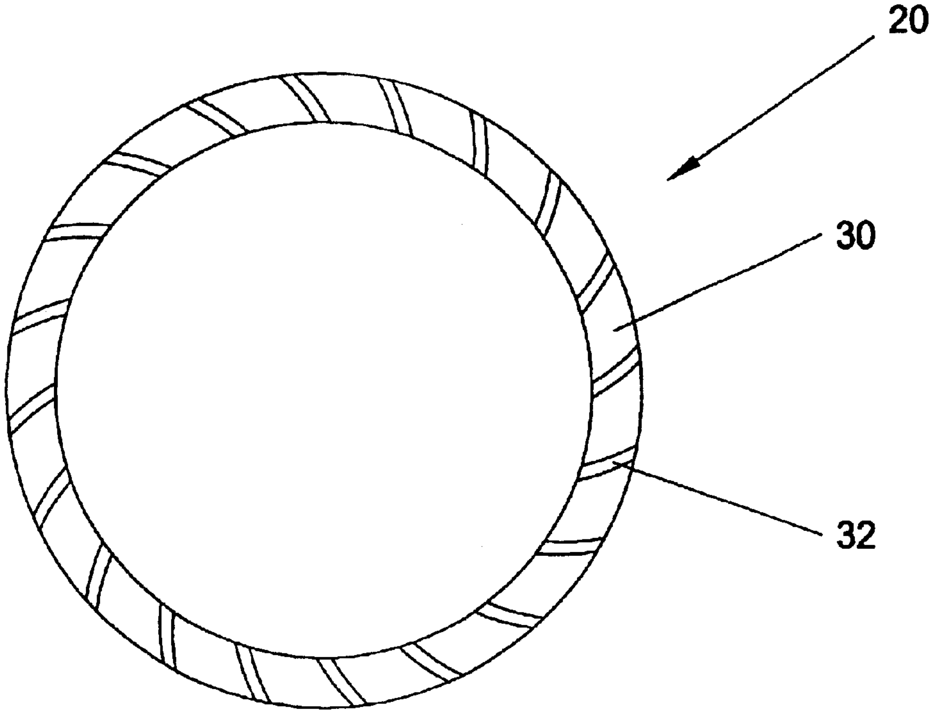
FIG. 2 is a bottom view of a conventional CMP retaining ring.

Referring now to FIG. 2, as shown in a bottom view, retaining ring 20 preferably has a polyphenylene sulfide surface 30 having a plurality of radial grooves 32 through which slurry, residue, rinsing agents and other materials may pass. A typically silica ($SiO_2$) or alumina ($Al_2O_3$) abrasive slurry 24 is dispensed onto pad 17 and flows through radial grooves 32, where it performs its polishing function between wafer 12 and pad 17. Since both wafer 12 and retaining ring 20 are contacting pad 17 during polishing, retaining ring surface 30 is gradually ground down after repeated use, so that the height of radial grooves 32 are shortened concurrently. As wafer 12 and retaining ring 20 are being polished against pad 17, miniscule particles from the wafer, ring and pad material are shed, mixing with abrasive slurry 24.

After CMP, polishing head 14 and wafer 12 are lifted, and pad 17 is generally subjected to a high-pressure spray of deionized (DI) water to remove slurry residue and other particulate matter from the pad. Other particulate matter may include wafer residue, CMP slurry, oxides, organic contaminants, mobile ions and metallic impurities. Wafer 12 is then subjected to a post-CMP cleaning process. When the next wafer 12 is polished, any remaining particulate matter from the prior polishing operation still remaining on the polishing head 14 or pad 17 may then contaminate this subsequent wafer, leaving more particles for a post-CMP clean operation to remove. As each additional wafer 12 is processed, a build-up of particulate matter may occur on polishing head 14 and pad 17, potentially leading to unacceptably high particle counts. The preconditioning method of the preferred embodiments may lower the amounts of particulate matter to an acceptable level.

Wafers entering a cleaning operation with fewer particles will generally emerge cleaner than wafers with an initially higher particle count, since cleaning steps generally have a limited particle removal rate. Initially cleaner wafers also possess a smaller number of particles that could redeposit back onto the wafer surface during cleaning. In addition, cleaner wafers will transfer less contamination to the next process tool, potentially reducing tool-to-wafer contamination as successive wafers pass through the fabrication process. Further, as scratches caused by particulate contamination cannot be removed during a post-CMP clean and may actually serve to trap particles, it is preferable to limit the amount of particles reaching a wafer in order to reduce the risk of wafer surface damage. Consequently, it is preferable to limit the amount of particles than may reach the wafer surface prior to wafer polishing.

The preferred embodiments of the present invention integrate a polishing pad and retaining ring preconditioning step with a conventional CMP operation to reduce particle levels on the polishing head and polishing pad of a CMP apparatus. Referring again to FIG. 1, a conventional CMP polishing head 14 is shown having a wafer 12 recessed inside pocket 22 with upward suction applied to its back surface in order to keep the wafer raised above the lower face of retaining ring 20. A spindle motor (not shown) then begins rotating polishing head 14 around spindle axis 26. Meanwhile, polishing head 14 is lowered, and retaining ring 20 is pressed onto polishing pad 17 with a downward pressure of preferably between about one and about five pounds per square inch (psi) and more preferably, about two psi. Polishing pad 17 and platen 16 are preferably rotated around platen axis 28 at a desired rate.

In a preferred embodiment of the present invention, polishing head 14 revolves around spindle axis 26 at a polishing speed, which is preferably between about 30 and about 130 revolutions per minute (rpm), depending on application, and more preferably, between about 55 and about 100 rpm's, and most preferably, at about 63 rpm's. Polishing pad rotates about platen axis 28, preferably at a rate between about 30 and about 130 rpm's, and more preferably, between about 50 and 90 rpm's. While polishing head 14 is revolving, preferably for between about 5 and about 120 seconds, and more preferably, for about 20 seconds, retaining ring 20 is subjected to a preconditioning period where the retaining ring 20 is polished by pad 17, with wafer 12 still recessed inside pocket 22, so that the wafer does not contact pad 17. For the duration of this preconditioning period, a cleaning chemistry comprising ammonium citrate is preferably sprayed or otherwise applied to the surface of pad 17.

Preferably, the cleaning chemistry may comprise a diluted commercially-available ammonium citrate solution, such as that manufactured by Applied Materials, Inc. under the trade name ElectraClean™. When used, the ammonium citrate is typically diluted in a 3:1 ratio with DI water, so that when used, it is an aqueous solution of preferably between about 5 percent and about 40 percent by weight, and more preferably, about 25 percent by weight of ammonium citrate. Although an aqueous ammonium citrate solution is disclosed in the preferred embodiments, it will be understood that other cleaning chemistries with different pH levels may also prove effective. Cleaning chemistries with relatively low pH values, such as those including ascorbic acid, citric acid or other citric-based solutions, may be effective at removing a particular type of slurry. Conversely, cleaning chemistries with relatively high pH values, such as tetramethylammonium hydroxide (TMAH) or potassium hydroxide (KOH), may be most effective at removing other types of slurries.

The cleaning chemistry is then at least partially removed from pad 17 with a rinsing liquid. Polishing pad 17 is preferably rinsed after preconditioning, and before wafer polishing, to remove at least a portion of the cleaning chemistry, particulate matter and other debris present on the polishing pad. The rinsing liquid, such as a high-pressure DI water spray, is applied to the surface of polishing pad 17. Preferably, polishing pad 17 is rinsed with a rinsing liquid of between about 0.5 and 3 gallons in volume, and more preferably, about one gallon in volume, and preferably, for between about two and about 60 seconds in duration, and more preferably, for about 20 seconds in duration. As retaining ring 20 is still contacting polishing pad 17 during the cleaning chemistry rinsing operation, it will be understood that the retaining ring is concurrently rinsed.

The ammonium citrate cleaning chemistry of the preferred embodiments preferably has a pH of between about 2 and about 5 or between about 8 and about 11, depending on whether a low-pH or high-pH solution is desired, and more preferably, of about 4 or about 8.5, respectively. Preferably, the cleaning chemistry of the preferred embodiments has a range of concentrations, depending on the pH of the cleaning chemistry, at which it is most effective. For low-pH cleaning chemistries, such as the ammonium citrate cleaning chemistry in accordance with the preferred embodiments, the cleaning chemistry is preferably an aqueous solution with a concentration of between about 5 and about 40 percent by weight, and more preferably, about 25 percent by weight. Alternatively, for high-pH cleaning chemistries in accordance with the preferred embodiments, the cleaning chemistry is preferably an aqueous solution with a concentration of below about 10 percent by weight, more preferably, between about 0.1 percent and about 8 percent, and most preferably, about 2 percent by weight. An alternative embodiment of the present invention may include a cleaning chemistry comprising an aqueous solution of surfactants and/or copper inhibitors, such as benzotriazole (BTA), mixed with ammonium citrate. Other cleaning chemistries may include aqueous solutions comprising ascorbic acid, citric acid or other citric-based solutions.

As polishing head 14 is still spinning, wafer 12 is lowered facedown inside pocket 22, contacting the surface of polishing pad 17 so that the wafer is substantially flush with and outwardly constrained by retaining ring 20. An abrasive slurry 24, typically silica ($SiO_2$) or alumina ($Al_2O_3$), is deposited onto pad 17, flowing through grooves 32, where it polishes the surface of wafer 12 at the interface between the wafer and pad 17. During operation, a preselected down force is preferably applied to wafer carrier 30 to achieve a desired polish pressure. Also during operation, wafer carrier 30 is preferably rotated at a desired rate while platen 16 is preferably rotated in an opposing direction at a desired rate.

Preferably, a slurry having a pH between about 3 and about 11 and comprised of slurry particles having an average diameter of between about 20 and about 200 nanometers (nm) is present during polishing. More preferably, the slurry particles are comprised of alumina or silica. The combined action of the down force of wafer carrier 30, the rotation of wafer carrier 30 and platen 16 and polishing pad 17, and the chemical and mechanical effects of the slurry combine to polish the surface of semiconductor wafer 12.

After polishing, head 14 and wafer 12 are lifted, and polishing pad 17 is generally subjected to a high-pressure spray of DI water to remove slurry residue, as well as any other particulate matter from the pad. Other particulate matter may include wafer residue, oxides, organic contaminants, mobile ions and metallic impurities. Wafer 12 is then transferred to a post-CMP cleaning process. As previously stated, although the preconditioning step of the preferred embodiments of the present invention have been demonstrated as preceding an individual wafer polish, it will be understood that when a sequence of wafers are polished, the preconditioning step of the present invention may be perceived as following a wafer polish.

The preferred embodiments of the present invention may be employed in combination with either a single-platen or a multi-platen CMP apparatus. A multi-platen CMP apparatus comprises a plurality of individual platens and their associated wafer carriers and polishing pads. Multi-platen CMP apparatuses allow for the processing of multiple wafers in parallel or in series. For example, a three-platen CMP apparatus could be used to process three wafers in parallel at three times the throughput of a single-platen CMP apparatus. Such an arrangement would typically use the same slurry, down force and rotation rates on each of the three platens.

Alternatively, where multiple CMP processes must be performed on each wafer, a multi-platen apparatus may be used to process wafers in series. For example, a three-platen CMP apparatus could be used to process three wafers in series wherein the wafer on the first platen is subjected to a first CMP process, the wafer on the second platen is subjected to a second CMP process, and the wafer on the third platen is subjected to a third CMP process. Such an arrangement would frequently use different slurries, down forces and/or rotation rates on each of the three platens depending on the nature of the individual CMP processes.

The duration of each CMP process may be determined by any suitable method. For example, the duration of each CMP process may be calculated by reference to the removal rate and the layer thickness. Alternatively, the duration of each CMP process may be determined using any suitable endpoint detection technique. For example, endpoint detection may involve an optical measurement in which an energy source impinges upon the wafer and the reflectivity of the wafer is measured. As the surface layer is removed from the wafer over time to expose the underlying layer, the reflectivity of the wafer may change measurably. Upon the detection of this change in surface reflectivity, the polishing process can be terminated.

By subjecting retaining ring 20 and polishing pad 17 to a preconditioning step in accordance with the preferred embodiment of the present invention, wafer defects, particulate buildup on polishing head 14, pad debris, and wafer-to-wafer contamination may all be reduced. Further, improved wafer cleanliness can also contribute to process improvements in subsequent photolithography steps, concurrently raising yield.

Experimentally, copper-processed wafers subjected to a preconditioning step in accordance with the preferred embodiment of the present invention show improvements in several key defect monitors when compared to "baseline" wafers, or wafers subjected to a conventional CMP process without the preconditioning step of the present invention. The sum of defects (SOD) indicator, a count of scattered laser light point defects, including surface irregularities and debris or other particulate matter, shows a downward shift in defect counts on wafers preconditioned in accordance with the preferred embodiments when compared to baseline wafers. Wafers preconditioned in accordance with the preferred embodiments showed approximately a 9 percent defect reduction over the baseline wafers.

Scratch defects are particularly troublesome, as grooves or notches on wafer surfaces may trap particles, making post-CMP cleans less effective and potentially causing local planarity issues in subsequent photolithography steps. When subjected to preconditioning in accordance with the preferred embodiments, copper-processed wafers showed approximately a 28 percent reduction in scratch defects, and approximately a 13 percent reduction in scratch lengths, as compared to baseline wafers. Area of area (A/A) is an indicator used to measure the sum of areas on a wafer having defects as a percentage of the total wafer area. This indicator is significant and closely monitored, as it may indicate a large cluster of defects. Copper-processed wafers preconditioned in accordance with the preferred embodiments showed approximately a 5 percent reduction in A/A when compared to baseline wafers. It is further likely that an even greater A/A reduction could be achieved if statistical outliers present were eliminated in an additional experimental run.

Even marginal improvements in defect reduction can pay dividends, since each integrated circuit rendered defective reduces profitability. With some high-volume wafer fabrication plants starting dozens of thousands of wafers per week, slight yield improvements may produce a wealth of additional good die. Efficiency and high production volumes are paramount to the success of wafer fabrication, so it is generally advantageous to perform process improvements with minimum disruption to an established process flow. The preconditioning step of the present invention affords the improvement of defect reduction within a pre-existing CMP apparatus, and would require a simple recipe change for implementation.

While the preferred embodiments of the present invention have been shown and described, modifications thereof can be made by one skilled in the art without departing from the spirit and teachings of the invention. The embodiments described herein are exemplary only, and are not intended to be limiting. Many variations and modifications of the invention disclosed herein are possible and are within the scope of the invention.

Accordingly, the scope of protection is not limited by the description set out above, but is only limited by the claims which follow, that scope including all equivalents of the subject matter of the claims. Each and every claim is incorporated into the specification as an embodiment of the present invention. Thus the claims are a further description and are an addition to the preferred embodiments of the present invention. Use of the term "optional" with respect to any element of a claim is intended to mean that the subject element is required, or alternatively, is not required. Both alternatives are intended to be within the scope of the claim.

The discussion of a reference in the Description of Related Art, if any, is not an admission that it is prior art to the present invention, especially any reference that may have a publication date after the priority date of this application. The disclosures of all patents, patent applications and publications cited herein are hereby incorporated herein by reference, to the extent that they provide exemplary, procedural or other details supplementary to those set forth herein.

What is claimed is:

1. A CMP process comprising the preconditioning steps of:

applying a cleaning chemistry to a polishing pad;

contacting said polishing pad with a retaining ring;

cleaning said retaining ring and said polishing pad with said cleaning chemistry while the polishing pad is not in contact with a wafer; and removing said cleaning chemistry from said polishing pad.

2. The process of claim 1 wherein pad preconditioning occurs prior to a wafer polishing process.

3. The process of claim 1 wherein pad preconditioning occurs subsequent to a wafer polishing process.

4. The process of claim 1 wherein said cleaning chemistry is also removed from said retaining ring.

5. The process of claim 1 wherein said polishing pad is rotated at a speed of between about 30 rpm and about 130 rpm.

6. The process of claim 5 wherein said polishing pad is rotated at a speed of between about 50 rpm and about 90 rpm.

7. The process of claim 1 wherein said polishing head is rotated at a speed of between about 30 rpm and about 130 rpm.

8. The process of claim 7 wherein said polishing head is rotated at a speed of between about 55 rpm and about 100 rpm.

9. The process of claim 1 wherein said retaining ring includes a polyphenylene sulfide surface.

10. The process of claim 1 wherein said retaining ring contacts said polishing pad with a pressure of between about 1 psi and about 5 psi.

11. The process of claim 10 wherein said retaining ring contacts said polishing pad with a pressure of about 2 psi.

12. The process of claim 1 wherein said cleaning chemistry comprises an aqueous solution of ammonium citrate.

13. The process of claim 12 wherein said cleaning chemistry comprises an aqueous solution between about 5 percent by weight and about 40 percent by weight of ammonium citrate.

14. The process of claim 13 wherein said cleaning chemistry comprises an aqueous solution of about 25 percent by weight of ammonium citrate.

15. The process of claim 12 wherein said cleaning chemistry comprises an aqueous solution of less than about ten percent by weight of ammonium citrate.

16. The process of claim 15 wherein said cleaning chemistry comprises an aqueous solution of about 2 percent by weight of ammonium citrate.

17. The process of claim 12 wherein said cleaning chemistry further includes a surfactant.

18. The process of claim 12 wherein said cleaning chemistry further includes a copper inhibitor.

19. The process of claim 12 wherein said cleaning chemistry further includes a surfactant and a copper inhibitor.

20. The process of claim 1 wherein said cleaning chemistry has a pH of between about 2 and about 5.

21. The process of claim 1 wherein said cleaning chemistry has a pH of about 4.

22. The process of claim 1 wherein said cleaning chemistry has a pH of between about 8 and about 11.

23. The process of claim 1 wherein said cleaning chemistry has a pH of about 10.5.

24. The process of claim 1 wherein said retaining ring is polished with said cleaning chemistry for between about 5 and about 120 seconds.

25. The process of claim 24 wherein said retaining ring is polished with said cleaning chemistry for about 20 seconds.

26. The process of claim 1 wherein at least a portion of said cleaning chemistry is removed from said polishing pad by a rinsing liquid.

27. The process of claim 26 wherein said cleaning chemistry is removed from said polishing pad by a high-pressure water spray.

28. The process of claim 27 wherein between about 0.5 gallons and about 3 gallons of water are sprayed onto said polishing pad.

29. The process of claim 28 wherein about 1 gallon of water is sprayed onto said polishing pad.

30. The process of claim 27 wherein said water spray has a duration of between about 2 and about 60 seconds.

31. The process of claim 30 wherein said water spray has a duration of about 20 seconds.

* * * * *